United States Patent
Yoo et al.

(10) Patent No.: US 11,528,804 B2
(45) Date of Patent: Dec. 13, 2022

(54) PRINTED CIRCUIT BOARD

(71) Applicant: SAMSUNG ELECTRO-MECHANICS CO., LTD., Suwon-si (KR)

(72) Inventors: Ga Young Yoo, Suwon-si (KR); Mi Sun Hwang, Suwon-si (KR); Jun Hyeong Jang, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 17/117,307

(22) Filed: Dec. 10, 2020

(65) Prior Publication Data

US 2022/0104345 A1  Mar. 31, 2022

(30) Foreign Application Priority Data

Sep. 28, 2020 (KR) .................. 10-2020-0125666

(51) Int. Cl.
*H05K 1/02* (2006.01)
*H05K 1/11* (2006.01)
*H05K 1/18* (2006.01)

(52) U.S. Cl.
CPC .......... *H05K 1/0298* (2013.01); *H05K 1/115* (2013.01); *H05K 1/111* (2013.01); *H05K 1/18* (2013.01)

(58) Field of Classification Search
CPC ............................. H05K 1/0298; H05K 1/115
See application file for complete search history.

(56) References Cited

U.S. PATENT DOCUMENTS

| | | | | |
|---|---|---|---|---|
| 8,686,300 B2 * | 4/2014 | Kawai | ........... | H05K 3/3457 174/262 |
| 2014/0360765 A1 * | 12/2014 | Kiwanami | ........... | H05K 1/185 174/260 |
| 2014/0367873 A1 * | 12/2014 | Yang | ........... | G02B 5/0215 264/2.5 |
| 2015/0034366 A1 * | 2/2015 | Yoshioka | ........... | H05K 3/0079 174/251 |
| 2015/0208517 A1 * | 7/2015 | Lee | ........... | H05K 3/4007 174/251 |
| 2016/0064319 A1 | 3/2016 | Suzuki | | |
| 2016/0143149 A1 * | 5/2016 | Su | ........... | H05K 1/188 174/251 |
| 2016/0343654 A1 * | 11/2016 | Kojima | ........... | H01L 23/49827 |
| 2022/0061147 A1 * | 2/2022 | Kim | ........... | H05K 1/025 |

FOREIGN PATENT DOCUMENTS

| | | | |
|---|---|---|---|
| KR | 10-2016-0026710 A | 3/2016 | |
| KR | 10-2017-0122500 A | 11/2017 | |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes: an insulating layer; and a first circuit layer disposed on an upper surface of the insulating layer. A lower surface of the first circuit layer is in contact with at least a portion of the insulating layer, and the first circuit layer includes a first region embedded in the insulating layer, and a second region protruding from the upper surface of the insulating layer.

22 Claims, 8 Drawing Sheets

'A'

'A'

'B'

'B'

'C'

'C'

PRINTED CIRCUIT BOARD

CROSS-REFERENCE TO RELATED APPLICATION(S)

This application claims benefit of priority to Korean Patent Application No. 10-2020-0125666 filed on Sep. 28, 2020 in the Korean Intellectual Property Office, the disclosure of which is incorporated herein by reference in its entirety.

TECHNICAL FIELD

The present disclosure relates to a printed circuit board, in particular, to a printed circuit board including a circuit layer having a partially embedded structure.

BACKGROUND

Recently, as the field of application of electronic devices including mobile products has been diversified, it is become necessary to process large-capacity, high-definition information at a high speed, and to reduce the weight of devices. Accordingly, a technology is being developed to reduce the thickness of products and to increase the production efficiency of high value-added products.

SUMMARY

An aspect of the present disclosure is to provide a printed circuit board in which a seed layer on a circuit layer is removed through a blasting method.

Another aspect of the present disclosure is to provide a printed circuit board having a circuit pattern of a partially embedded structure of a new type, different from the conventional structure.

Another aspect of the present disclosure is to provide a printed circuit board having improved bonding strength with a solder.

Another aspect of the present disclosure is to provide a printed circuit board having improved process efficiency during manufacturing by eliminating a pretreatment process of a solder resist layer.

One of the various solutions proposed through the present disclosure is to remove a seed layer through a blasting process, and perform the blasting process on a circuit layer and an insulating layer below the seed layer to implement a structure of a partially embedded circuit layer.

For example, according to an aspect of the present disclosure, a printed circuit board includes: an insulating layer; and a first circuit layer disposed on an upper surface of the insulating layer. A lower surface of the first circuit layer is in contact with at least a portion of the insulating layer, and the first circuit layer may include a first region embedded in the insulating layer and a second region protruding from the upper surface of the insulating layer.

For example, according to an aspect of the present disclosure, a printed circuit board includes: an insulating layer; and a first circuit layer disposed on an upper surface of the insulating layer. A lower surface of the first circuit layer is in contact with at least a portion of the insulating layer, and roughness may be formed on an upper surface of the first circuit layer.

For example, according to an aspect of the present disclosure, a printed circuit board includes: an insulating layer; and a circuit layer disposed on an upper surface of the insulating layer. Patterns of the circuit layer each include at least a portion protruding from the upper surface of the insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
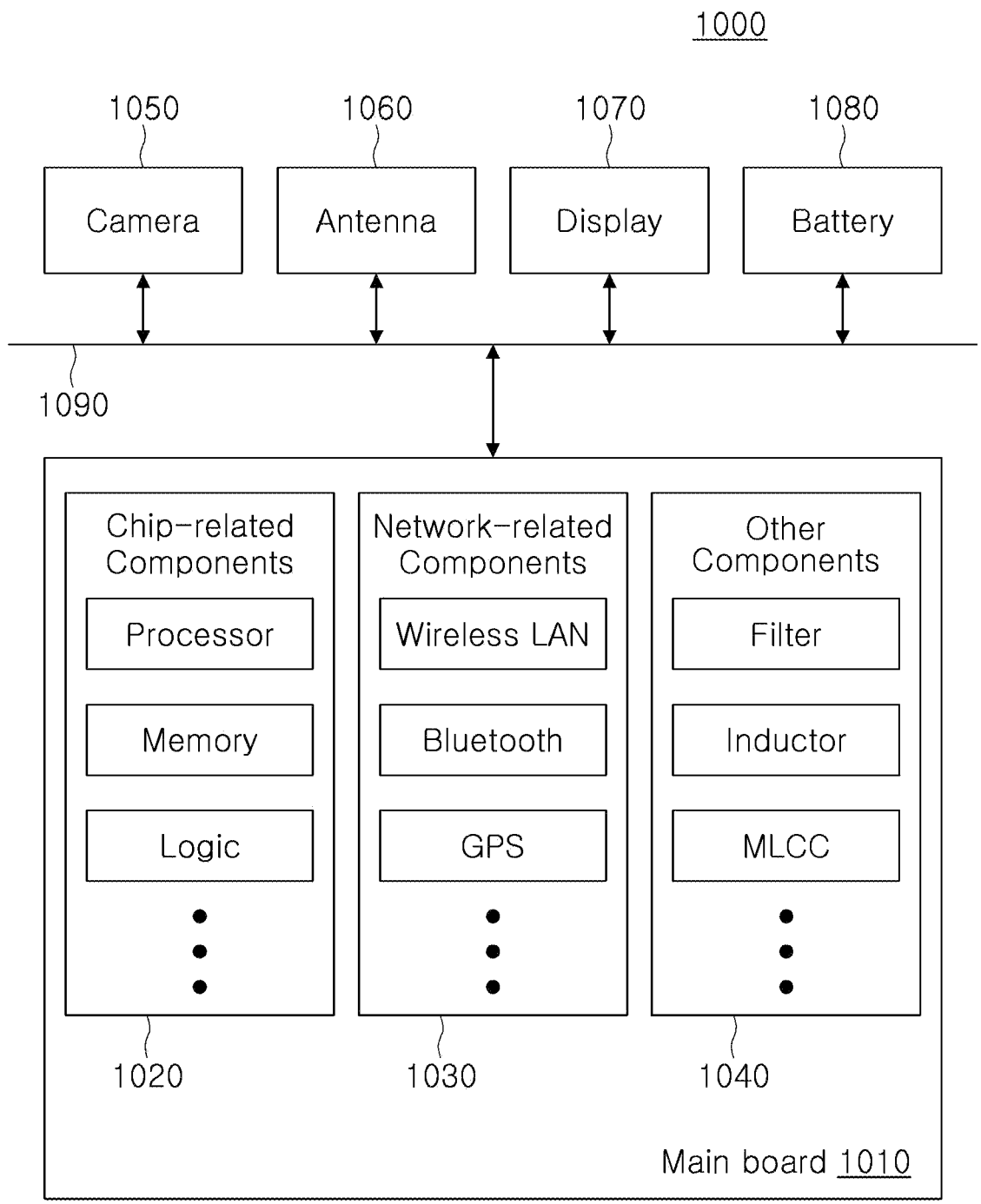
FIG. 1 is a block diagram schematically illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a block diagram schematically illustrating an example of an electronic device system Referring to FIG. 1, an electronic device 1000 may accommodate a main board 1010. The main board 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
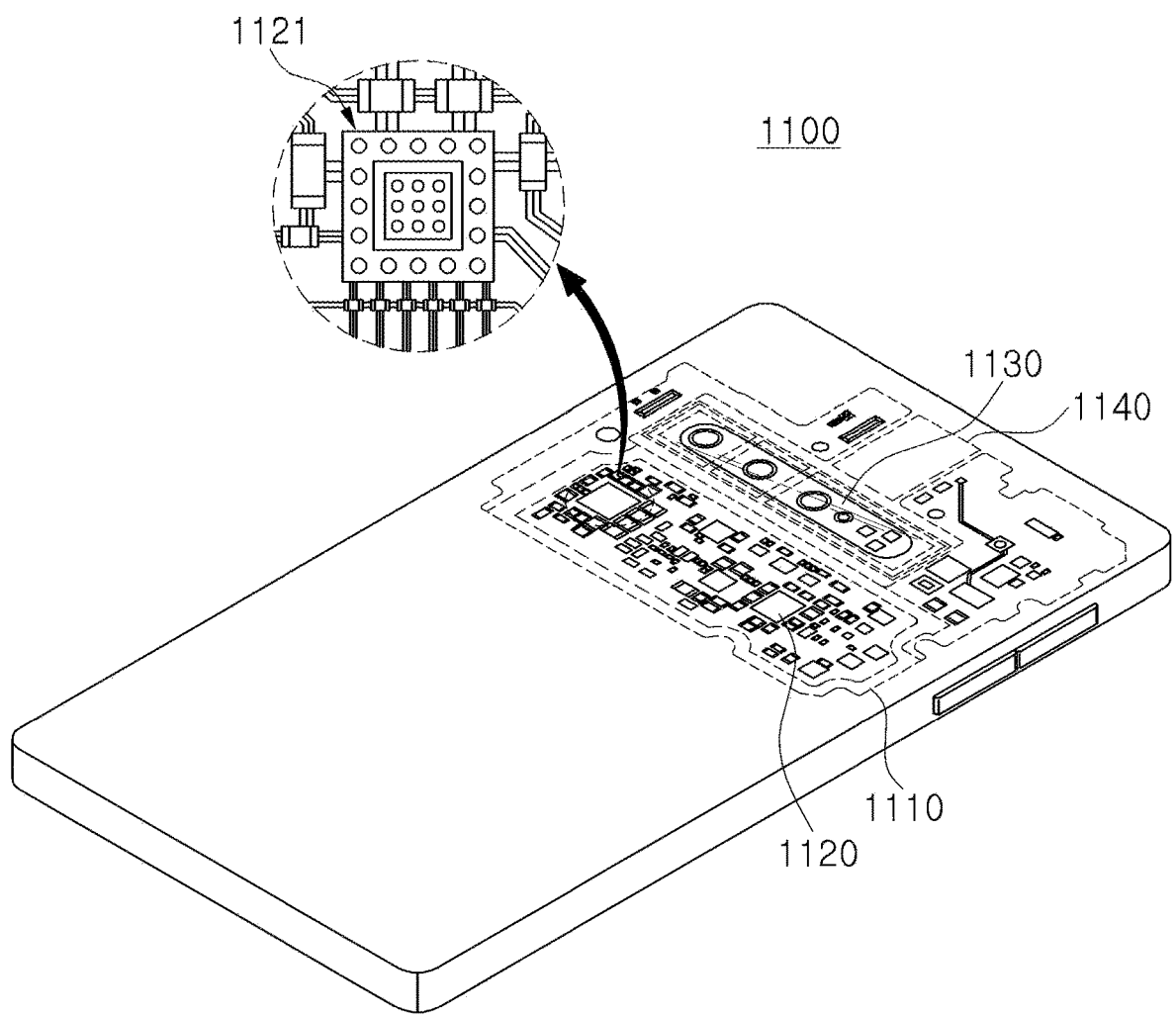
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 may be accommodated in the smartphone 1100, and various electronic components 1120 may be physically and/or electrically connected to the motherboard 1110. In addition, a camera module 1130 and/or a speaker 1140, and the like, may be accommodated in the smartphone 1100. Some of the electronic components 1120 may be the chip related components, for example, an electronic component-embedded substrate 1121, but are not limited thereto. The electronic component-embedded substrate 1121 may have a form in which an electronic component is embedded in a multilayer printed circuit board, but is not limited thereto. The electronic device is not necessarily limited to the smartphone 1100, but may be other electronic devices as described above.

Figure 3:
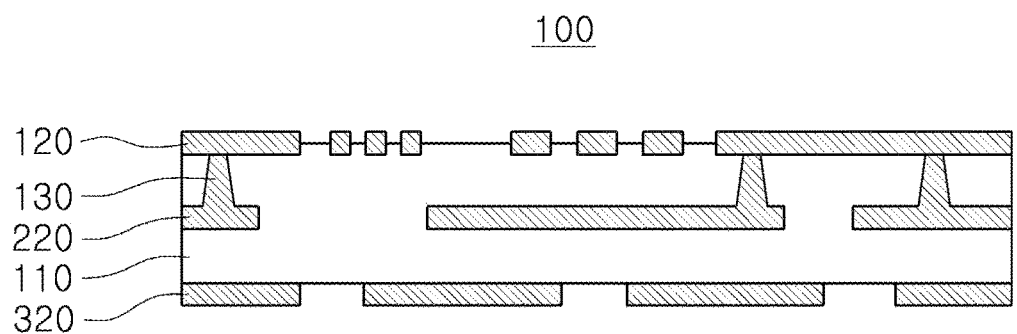
FIG. 3 is a schematic cross-sectional view of a printed circuit board according to a first embodiment of the present disclosure.

FIG. 3 is a schematic cross-sectional view of a printed circuit board according to a first embodiment of the present disclosure.

A printed circuit board 100 according to a first embodiment of the present disclosure disclosed in FIG. 3 includes an insulating layer 110, a first circuit layer 120 disposed on an upper surface of the insulating layer 110, a plurality of inner circuit layers 220 disposed inside the insulating layer 110, a second circuit layer 320 disposed on a lower surface of the insulating layer 110, and a via 130 connecting at least portions of the first and second circuit layers 120 and 320 and the inner circuit layers 220.

As disclosed in FIG. 3, the first circuit layer 120 of the printed circuit board 100 according to the first embodiment of the present disclosure is disposed on an upper surface of the insulating layer 110, a portion thereof is embedded inside the insulating layer 110, and the other portion that is not embedded in the insulating layer protrudes above the insulating layer 110. As the first circuit layer 120 protrudes above the insulating layer 110 as described above, when a solder 140 to be described later is disposed above the first circuit layer 120, a heterogeneous interface between the solder 140 and the first circuit layer 120 is formed, but unlike a structure that formed a heterogeneous interface with other configurations in the prior art, since it forms the heterogeneous interface only with the first circuit layer 120, adhesion between the solder 140 and the first circuit layer 120 may be improved.

In addition, roughness is formed on the upper surface of the first circuit layer 120 of the printed circuit board 100 of FIG. 3, and roughness is also formed on a region of the upper surface of the insulating layer 110, exposed by the first circuit layer 120. When the roughness is formed as described above, when lamination of a different configuration is performed thereabove, adhesion with the corresponding configuration can be improved.

Meanwhile, a side surface of the first circuit layer 120 may be exposed as the insulating layer 110 is etched by a blasting method. In this case, a side surface of the first circuit layer 120 is also affected by the blasting process, and thus, may be partially etched. Therefore, roughness may be formed not only on the upper surface of the first circuit layer 120, but also on the side surface thereof.

In this case, the upper surface of the first circuit layer 120, on which the blasting method was performed after a copper foil layer 10, functioning as a seed layer of the first circuit layer 120, was removed, may have a relatively larger roughness than that of the side surface of the first circuit layer 120 exposed to the blasting process from a point after the insulating layer 110 is etched.

In addition, considering that the insulating layer 110 is etched downward as the blasting process progresses, time of the side surface of the first circuit layer 120, affected by the blasting process from the outside to the inside of the printed circuit board may be short.

In other words, the side surface of the first circuit layer 120 may have roughness formed on a surface by the blasting process from a point when the insulating layer 110 covering the side surface is etched, and a degree of formation of the roughness may be proportional to a degree to which the blasting process has been performed.

Accordingly, as the insulating layer 110 is etched from the outside of the substrate toward the inside, the side surfaces of the first circuit layer 120 are sequentially exposed, such that the closer to the outside of the substrate among the side surfaces of the first circuit layer 120, the greater the roughness may be formed, and the closer to the inner side of the substrate among the side surfaces of the first circuit layer 120, the smaller the roughness may be formed. In one example, the portion of the side surfaces of the first circuit layer 120 embedded in the insulating layer 110 may have roughness less than roughness of the portion of the side surfaces of the first circuit layer 120 exposed from the insulating layer 110, since the blasting process may not be performed to the embedded portion of the first circuit layer 120.

In addition, as described above, a region of the upper surface of the insulating layer 110, exposed by the first circuit layer 120 may also have roughness formed therein. In this case, a region of the upper surface of the insulating layer 110, covered by the first circuit layer 120 may be relatively less affected by the blasting process.

Meanwhile, the printed circuit board according to the first embodiment of FIG. 3 discloses the configuration of first, second, and inner circuit layers, but a plurality of insulating layers or circuit layers may be stacked without limitation as needed.

FIGS. 4 to 11 are process diagram schematically illustrating an example of manufacturing the printed circuit board of FIG. 3.

A method of manufacturing a printed circuit board according to FIGS. 4 to 11 illustrates a method of building-up based on one surface of a copper clad laminate 12, but the printed circuit board according to the present disclosure is not limited to a method of build-up based on one surface. If necessary, it can also be manufactured through a build-up process based on both surfaces.

Figure 4:
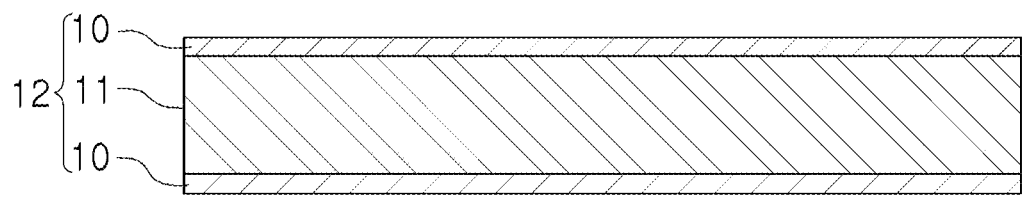
FIGS. 4 to 11 are process diagrams schematically illustrating an example of manufacturing the printed circuit board of FIG. 3.

FIG. 4 discloses a structure of a copper clad laminate 12. The copper clad laminate (CCL) is manufactured by heating and pressing a copper foil layer 10, in a state in which the copper foil layer 10 is laminated on upper and lower portions of the core insulating layer 11. The core insulating layer 11 may include an insulating material used a conventional detach carrier foil (DCF) to be separated from the copper foil layer 10 later, and as the insulating material, a thermosetting resin such as an epoxy resin, a thermoplastic resin such as polyimide, or a material including a reinforcing material such as Woven Glass Fiber and/or an inorganic filler together with them, for example, Prepreg, ABF (Ajinomoto Build-up Film), PID (Photo Image-able Dielectric), and the like may be used.

Figure 5:
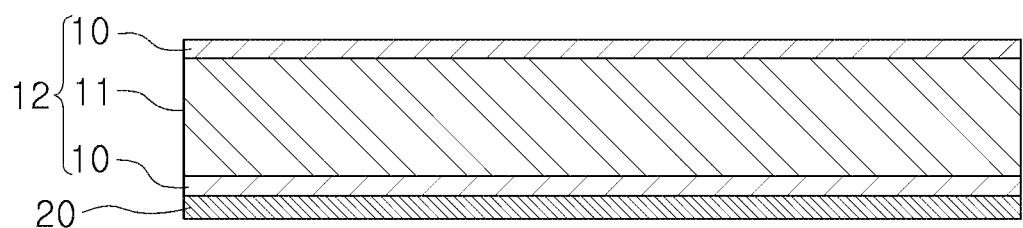

As disclosed in FIG. 5, a metal layer 20 to be used when forming the circuit layer of the present disclosure may be stacked on one surface or both surfaces of the copper foil layer 10. The metal layer 20 may include a metal material, as the metal material, copper (Cu), aluminum (Al), silver (Ag), tin (Sn), gold (Au), nickel (Ni), lead (Pb), titanium (Ti), or alloys thereof may be used, and any conductive metal may be used without particular limitation.

Figure 6:
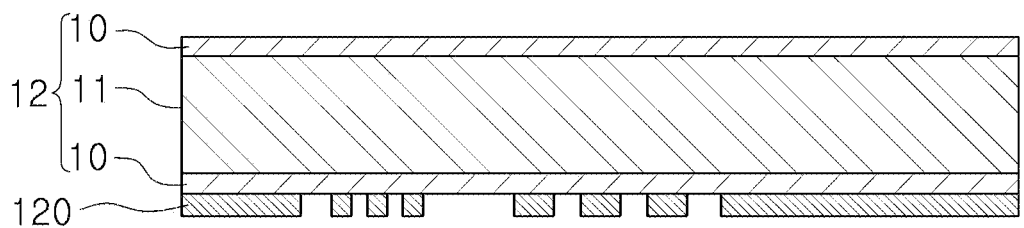

Thereafter, as disclosed in FIG. 6, a first circuit layer 120 may be formed through patterning of the metal layer 20. The first circuit layer 120 may be formed by an additive process (AP), a semi AP (SAP), a modified SAP (MSAP), tenting (TT), or the like, and may include an electrolytic plating layer using the copper foil layer 10 as a seed layer, and formed based on the copper foil layer 10.

Figure 7:
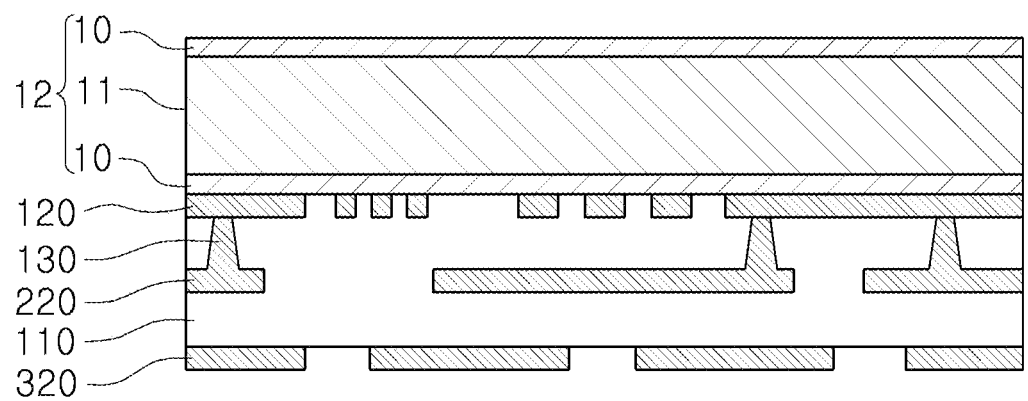

Subsequently, FIG. 7 shows a structure in which a printed circuit board including an insulating layer 110 stacked above the first circuit layer 120, an inner circuit layer 220, a via 130 connecting the first circuit layer 120 and the inner circuit layer 220, and a second circuit layer 320 disposed on the insulating layer 110.

The insulating layer 110 may include a conventional insulating material, and as the insulating material, a thermosetting resin such as an epoxy resin, a thermoplastic resin such as polyimide, or a material including a reinforcing material such as Woven Glass Fiber and/or an inorganic filler, for example, prepreg, an Ajinomoto Build-up Film (ABF), a photo image-able dielectric (PID), or the like may be used.

The inner circuit layer, the second circuit layers 220 and 320, and the via 130 may include a metal material, and as the metal material, copper (Cu), aluminum (Al), silver (Ag), and tin (Sn), gold (Au), nickel (Ni), lead (Pb), titanium (Ti), or an alloy thereof may be used, and any metal having conductivity may be used without particular limitation. In addition, the inner circuit layer and the second circuit layers 220 and 320 may be formed by a process such as an additive process (AP), a semi AP (SAP), a modified SAP (MSAP), tenting (TT), or the like.

FIG. 7 shows a structure in which the second circuit layer 320 is also formed, but a printed circuit board having a structure including an additional circuit layer and a via may also be formed in the same manner as necessary.

Figure 8:
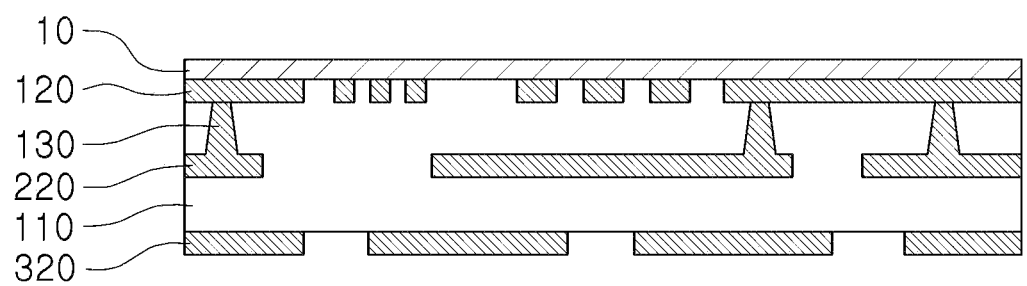

Thereafter, as disclosed in FIG. 8, of the upper copper clad laminate 12, a core insulating layer 11 made of a DCF material and a part of the copper foil layer 10 may be peeled off. Accordingly, a copper foil layer 10 used as a seed layer is disposed above the first circuit layer 120 of the printed circuit board.

Figure 9:
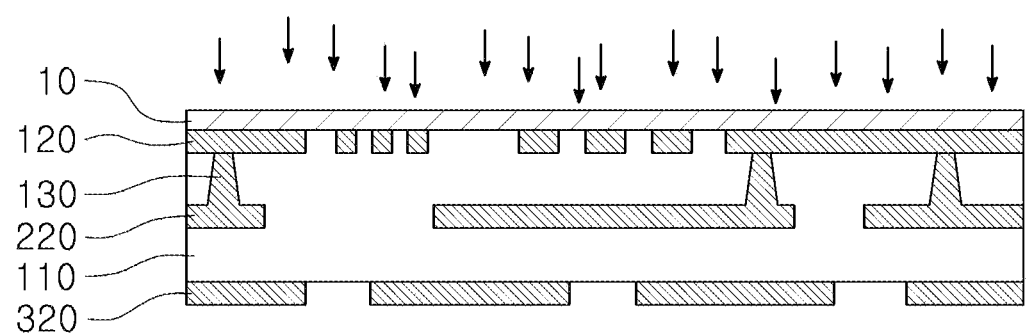
Figure 10:
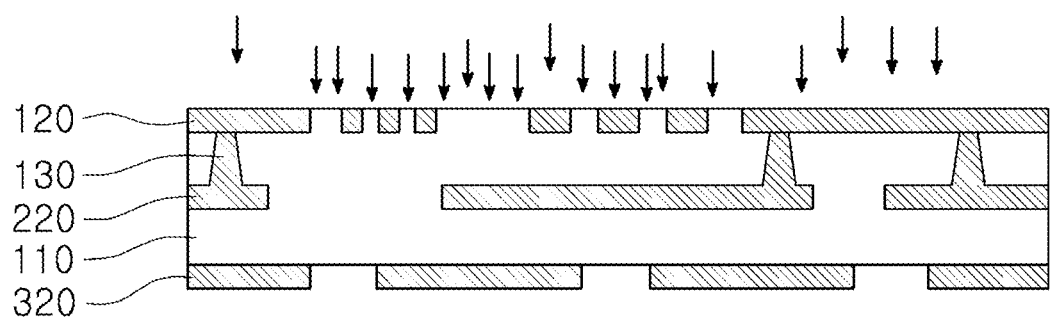

Thereafter, according to FIG. 9, the copper foil layer 10 thereabove may be removed through a conventional blasting method. The blasting method includes conventional microblasting and sand blasting methods.

In a sand blasting processing step, the copper foil layer 10 disposed above the first circuit layer 120 may be removed to protrude a part of the first circuit layer 120 and the insulating layer 110.

Sand blasting processing is a processing method of polishing or cutting a surface of a material by spraying an abrasive material from a nozzle, and in the past, sand was sprayed with a grinding material, so it was named sand blasting, but in present, various particles such as ceramic powder such as alumina (aluminum oxide), silicon carbide, glass beads, plastic powder, or the like, can be used as the grinding material. Types of sand blasting may include wet sand blasting, which is processed by spraying from a nozzle after mixing an abrasive material and water, and air sand blasting, which is processed by spraying only the abrasive material from the nozzle using air.

Referring to FIG. 8, the copper foil layer 10 is processed and removed through sand blasting processing. Thereafter, the upper portions of the first circuit layer 120 and the insulating layer 110 are exposed, and the exposed first circuit layer 120 and the insulating layer 110 are also subjected to blasting processing.

In the blasting processing process, since the first circuit layer 120 is made of a metal material, less abrasion or cutting is performed by sand blasting processing than the insulating layer 110 made of a resin material. In other words, it is possible to easily form the first circuit layer 120 in which only a portion protrudes and the remaining portion thereof is embedded by sandblasting processing by using a difference in abrasion resistance between metal and a resin. The first circuit pattern 120, in which only a portion thereof protrudes basically has an embedded trace substrate (ETS) structure, and may be easily connected to an external terminal through the protruding upper surface.

In addition, since the blasting process is performed entirely above the first circuit layer 120, a step may be generated in each region of the first circuit layer 120, thereby preventing the thickness of each region from being formed differently.

Figure 11:
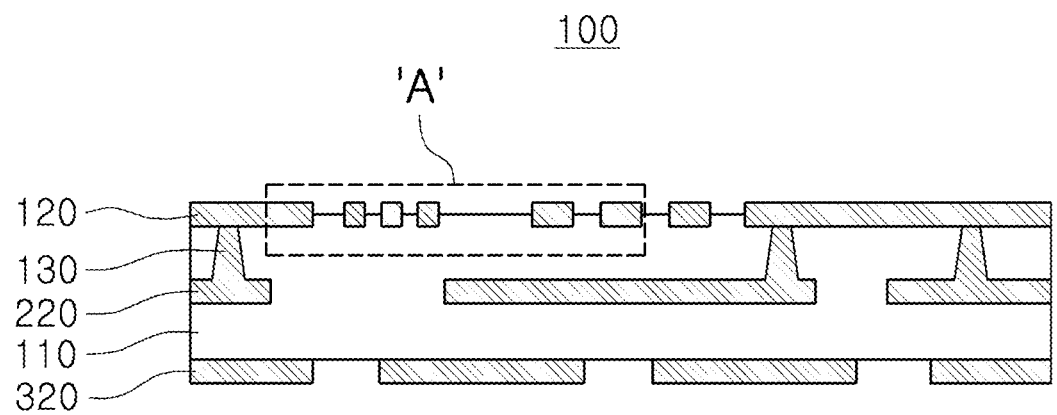

A structure in which a portion of the first circuit layer 120 protrudes is disposed in FIG. 11, which corresponds to the structure of a printed circuit board 100 according to the first embodiment of the present disclosure disclosed in FIG. 3. As described above, when blasting processing is performed above the first circuit layer 120 and the insulating layer 110 from which the copper foil layer 10 is removed, both the first circuit layer 120 and the insulating layer 110 may be etched. Thereamong, as an etching rate of the insulating layer 110 having a softer characteristic is higher than that of the first circuit layer 120 made of a metal material, the insulating layer 110 is etched more than the first circuit layer 120 in the same process and is removed. Accordingly, the upper surface of the insulating layer 110 may have a structure in which a step is formed on the upper surface of the first circuit layer 120, and a portion of the first circuit layer 120 protrudes above the insulating layer 110.

In addition, according to the blasting processing, the abrasive material used for the blasting processing may remain on the surface in at least one region above the first circuit layer 120 and the insulating layer 110, which can also be removed by a washing process or a chemical treatment process.

However, roughness may be formed above the first circuit layer 120 and the insulating layer 110 by blasting processing. The roughness of the surface of the first circuit layer 120 formed by a blasting abrasive material may contribute to securing adhesion when bonding with a structure such as a solder resist or a solder ball disposed above the first circuit layer 120 later. Typically, for bonding with other components above the first circuit layer 120, a surface pretreatment process is performed later. In the case of the printed circuit board 100 according to the present disclosure, since an upper surface of the first circuit layer 120 is roughened by the blasting abrasive material, it can be bonded to the upper solder resist layer or the solder in a state securing adhesion without a separate surface pretreatment process.

In addition to the first circuit layer 120, the upper portion of the insulating layer 110 may also be roughened by a blasting abrasive material. In this case, a region of the upper surface of the insulating layer 110 exposed by the first circuit layer 120 may be roughened by blasting processing, and a blasting abrasive material may remain on the surface thereof.

Figure 12:
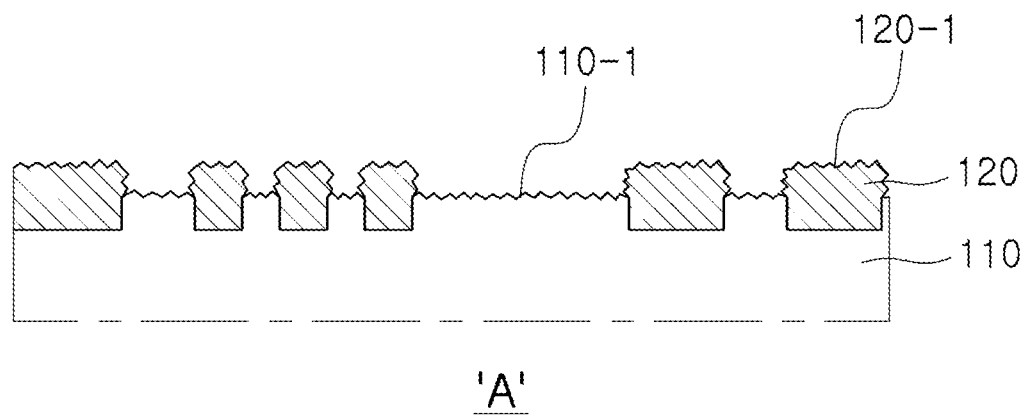
FIG. 12 is an enlarged cross-sectional view showing an enlarged portion A of the printed circuit board of FIG. 11.

FIG. 12 is an enlarged cross-sectional view showing an enlarged region A of the printed circuit board of FIG. 11.

In the case of FIG. 12, the first circuit layer 120 having a partially embedded structure in region A is specifically illustrated. As described above, the first circuit layer 120 may include a first region embedded in the insulating layer 110 and a second region protruding above the insulating layer 110 due to a difference in etching rate from the insulating layer 110. In addition, roughness may be formed in a region 110-1 exposed from the first circuit layer 120 among the upper surface 120-1 of the first circuit layer 120 and the upper surface of the insulating layer 110 by the abrasive material during blasting processing. Due to the roughness, sufficient adhesion may be secured on a solder resist layer, a solder ball, or a heterogeneous interface with a solder that may be bonded later.

Figure 13:
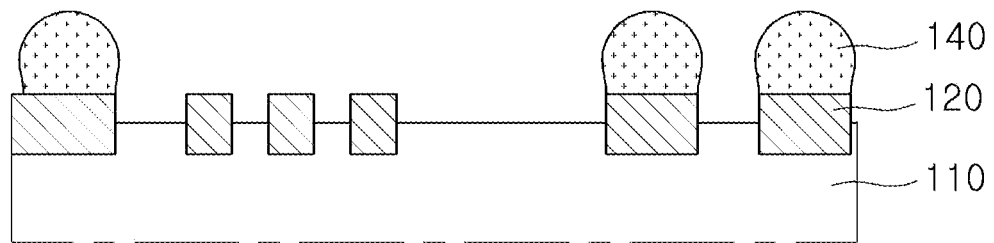
FIG. 13 is an enlarged cross-sectional view of a region A of a structure in which a solder is disposed on the printed circuit board of FIG. 11.

FIG. 13 is an enlarged cross-sectional view of region A of a structure in which a solder is disposed on the printed circuit board of FIG. 11.

As shown in FIG. 13, in the case of the printed circuit board 100 according to the present disclosure, a solder 140 may be disposed above the first circuit layer 120. In the case of a printed circuit board of a conventional ETS structure, when an upper surface of a circuit pattern is disposed in a position, lower than the upper surface of the insulating layer, to disclose a structure embedded in the insulating layer, a solder may form a heterogeneous interface with the circuit layer and the insulating layer on the side surface, respectively, such that a problem of securing adhesion with both may occur.

The printed circuit board according to the present disclosure discloses a structure in which a portion of the first circuit layer 120 protrudes above the insulating layer 110. Since a heterogeneous interface only between the solder 140 and the first circuit layer 120 is formed, it is not a problem to secure adhesion with the insulating layer 110. In addition, as described above, since roughness is formed on an upper portion of the first circuit layer 120 by blasting processing, adhesion between the first circuit layer 120 and the solder 140 may be sufficiently secured. In addition, prior to bonding with the solder 140, since a surface pretreatment process is not separately required, productivity improvement and process time reduction effects may be achieved.

Figure 14:
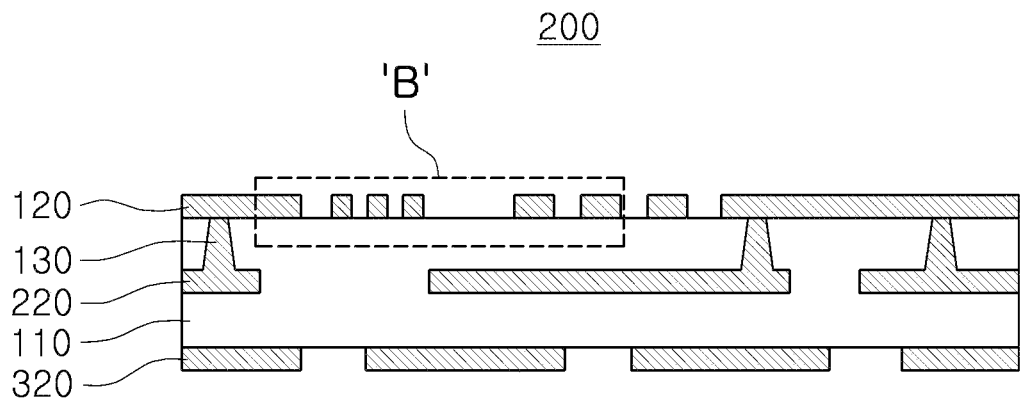
FIG. 14 is a schematic cross-sectional view of a printed circuit board according to a second embodiment of the present disclosure.

FIG. 14 is a schematic cross-sectional view of a printed circuit board according to a second embodiment of the present disclosure.

In the case of a printed circuit board 200 according to a second embodiment, blasting processing is performed as in the first embodiment described above. However, compared to the case of the printed circuit board 100 according to the first embodiment, the blasting processing is performed for a relatively long time or with strong strength, and there is a difference in an amount of polishing or etching thereof. Therefore, the amount of the insulating layer 110 made of a relatively soft material is further increased than the first circuit layer 120, and as a result, a structure of a second embodiment of the structure in which the first circuit layer 120 completely protrudes above the first insulating layer 110 may be derived.

Figure 15:
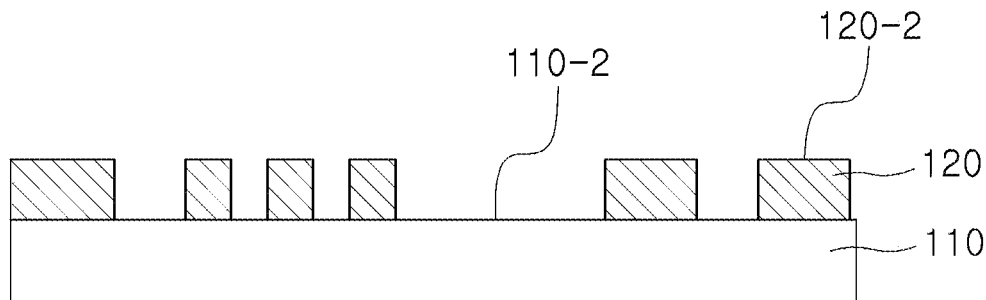
FIG. 15 is an enlarged cross-sectional view showing an enlarged region B of the printed circuit board of FIG. 14.

FIG. 15 is an enlarged cross-sectional view showing an enlarged area B of the printed circuit board of FIG. 14.

As shown in FIG. 15, a structure in which the first circuit layer 120 completely protrudes above the insulating layer 110 may be disclosed. In this case, a lower surface of the first circuit layer 120, an upper surface 110-2 of the insulating layer 110 exposed by the first circuit layer 120 may form coplanar therewith.

Even in this case, as in the first embodiment, roughness may be formed on an upper surface 120-2 of the first circuit layer 120 and an upper surface 110-2 of the insulating layer exposed by the first circuit layer 120 by a blasting abrasive material, and thus, when an upper insulating layer, a solder resist layer, or a solder which is not shown, is bonded later, adhesion may be secured.

In addition, since the blasting process is performed entirely above the first circuit layer 120, a step is generated in each region of the first circuit layer 120, thereby preventing the thickness of each region from being formed differently.

Other features related to the overlapping configuration may be the same as those of the first embodiment described above, and descriptions of the overlapping contents will be omitted.

Figure 16:
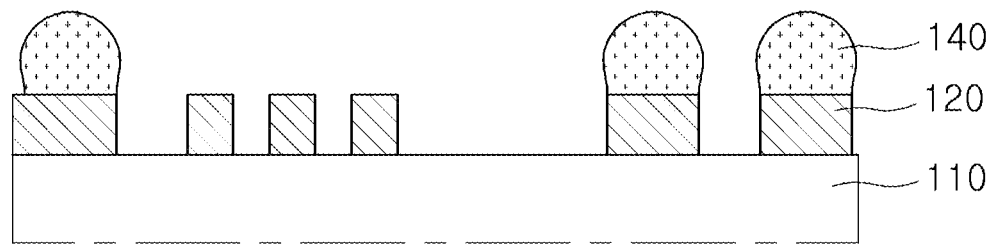
FIG. 16 is an enlarged cross-sectional view of region B of a structure in which a solder is disposed on the printed circuit board of FIG. 14.

FIG. 16 is an enlarged cross-sectional view of region B of a structure in which a solder is disposed on the printed circuit board of FIG. 14.

As shown in FIG. 16, in the case of a printed circuit board 200 according to the present disclosure, a solder 140 may be disposed above the first circuit layer 120. In the case of a printed circuit board having a conventional ETS structure, when an upper surface of a circuit pattern is disposed in a position lower than the upper surface of the insulating layer, and a structure embedded in the insulating layer is disposed, since a solder may form a heterogeneous interface with the circuit layer and the insulating layer on the side surface, respectively, a problem of securing adhesion therebetween may occur.

In the printed circuit board 200 according to the second embodiment of the present disclosure, since a structure, in which the first circuit layer 120 completely protrudes above the insulating layer 110 is disclosed, and a heterogeneous interface is formed only between the solder 140 and the first circuit layer 120, securing adhesion with the insulating layer 110 is not a problem. In addition, as described above, since roughness is formed above the first circuit layer 120 by blasting processing, adhesion between the first circuit layer 120 and the solder 140 can be sufficiently secured. In addition, prior to bonding with the solder 140, since a surface pretreatment process is not separately required, productivity improvement and process time reduction effects can be achieved.

Figure 17:
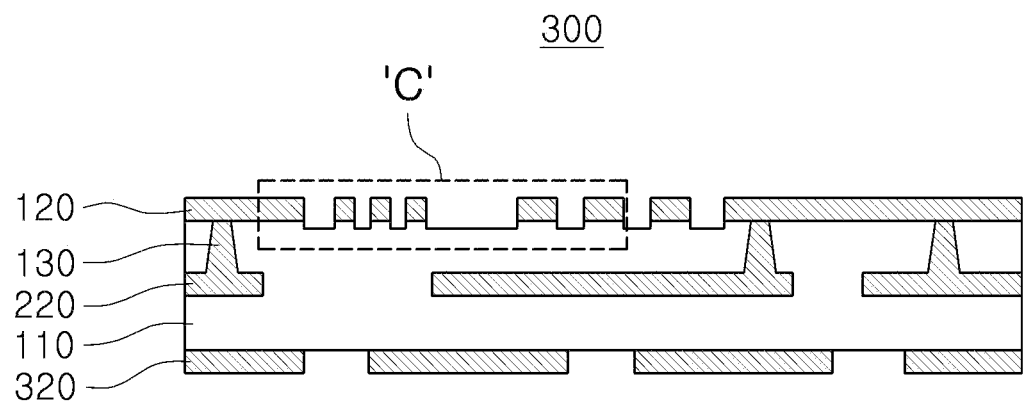
FIG. 17 is a schematic cross-sectional view of a printed circuit board according to a third embodiment of the present disclosure.

FIG. 17 is a schematic cross-sectional view of a printed circuit board according to a third embodiment of the present disclosure.

In the case of FIG. 17, a drawing of a printed circuit board 300 according to a third embodiment is disclosed, which discloses a structure in which a recess portion 110h is formed in the insulating layer 110 by blasting processing for a relatively long time or with strong strength, as compared with the printed circuit board of the second embodiment.

In the case of the printed circuit board 300 according to the third embodiment shown in FIG. 17, due to blasting processing, a region exposed from the first circuit layer 120 of the upper surface of the insulating layer 110 may be located below the lower surface of first circuit layer 120.

This is a result of characteristics of the above-described insulating material including a material that is softer to blasting processing than a metal material, which is a result of a process in which the insulating layer 110 is etched relatively more than the second embodiment. Therefore, by etching of the insulating layer 110 exposed from the first circuit layer 120, the recess portion 110h may be formed, and a structure in which a step is formed on the upper surface of the insulating layer 110 may be derived. According to the present embodiment, the first circuit layer 120 may be disposed in a region, except for the recess portion 110h of the upper surface of the insulating layer 110, and a region covered by the first circuit layer 120 may be maintained without being etched.

Figure 18:
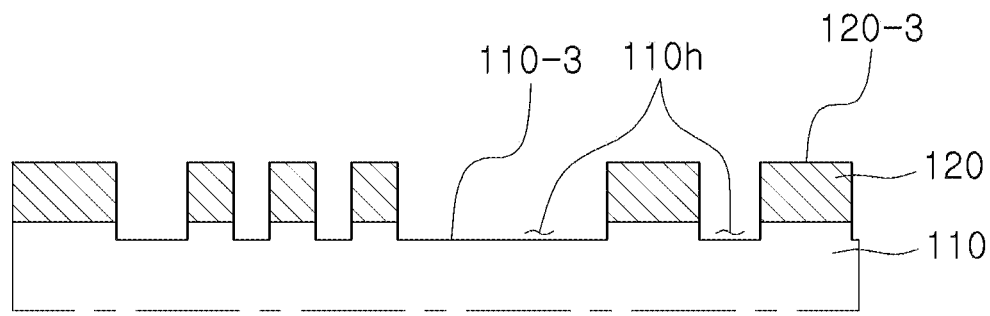
FIG. 18 is an enlarged cross-sectional view showing an enlarged region C of the printed circuit board of FIG. 17.

FIG. 18 is an enlarged cross-sectional view showing an enlarged C region of the printed circuit board of FIG. 17.

In the specific illustration of FIG. 18, a structure in which a recess portion 110h is formed on an upper surface 110-3 of the insulating layer 110 is disclosed, and the first circuit layer 120 may be disposed in a region in which the recess portion 110h is not formed of the upper surface 110-3 of the insulating layer 110 as described above. Similarly in the third embodiment, a surface of the upper surface 120-3 of the first circuit layer 120 and a surface of the upper surface 110-3 of the insulating layer 110 exposed by the first circuit layer 120 may be roughened by a blasting abrasive material, and in the case in which an upper insulating layer, a solder resist layer, or a solder, which is not shown, is bonded later, adhesion can be secured. The upper surface 110-3 of the insulating layer exposed by the above-described first circuit layer 120 may correspond to a lower surface of the recess portion 110h according to the formation of the recess portion 110h, and the lower surface of the portion 110h may have roughness formed therein.

In addition, a region covered by the first circuit layer 120 of the upper surface 110-3 of the insulating layer 110 described above may be relatively less affected by a blasting process than a region in which the recess portion 110h is not formed of the upper surface 110-3 of the insulating layer 110. However, since the recess portion 110h is formed, a side surface may be formed in a region of the insulating layer 110 covered by the first circuit layer 120. In other words, the side surface of the recess portion 110h may also be exposed to the blasting process, and in the blasting process after the time when the recess portion 110h is formed, the side surface of the recess portion 110h, that is, the side surface of the region of the insulating layer 110 covered by the first circuit layer 120 may also have roughness formed therein.

Specifically, the side surface of the recess portion 110h may be exposed as the insulating layer 110 is etched more deeply toward an inner layer than the lower surface of the first circuit layer 120 by a blasting method. In this case, the side surface of the recess portion 110h may also be affected by the blasting process, and thus, may be partially etched. Accordingly, roughness may be formed not only on the lower surface of the recess portion 110h but also on the side surface thereof. In this case, the lower surface of the recess portion 110h on which the blasting method is performed after the copper foil layer 10, which used to serve as the seed layer of the first circuit layer 120, has removed, may have a relatively larger roughness than the side surface of the recess portion 110h exposed to the blasting process from a point after the recess portion 110h is formed.

In addition, considering that the insulating layer 110 is etched downward as the blasting process progresses, the time at which the side surface of the recess portion 110h is affected by the blasting process from the outside to the inside of the printed circuit board may be short. In other words, on the side surface of the recess portion 110h, roughness may be formed from a point when the insulating layer 110 is etched to be concave toward the inner side of first circuit layer 120 than the lower surface thereof, that is, a point when the recess portion 110h is formed on the surface thereof, and a degree of formation of the roughness may be proportional to a degree of the blasting process.

Therefore, as the insulating layer 110 is etched from the outside of the substrate toward the inside, since the side surfaces of the recess portion 110h are sequentially exposed, the closer to the outside of the substrate among the side surfaces of the recess portion 110h, the greater the roughness which may be formed, and the closer to the inner side of the substrate among the side surfaces of the recess portion 110h, the smaller the roughness which may be formed.

Figure 19:
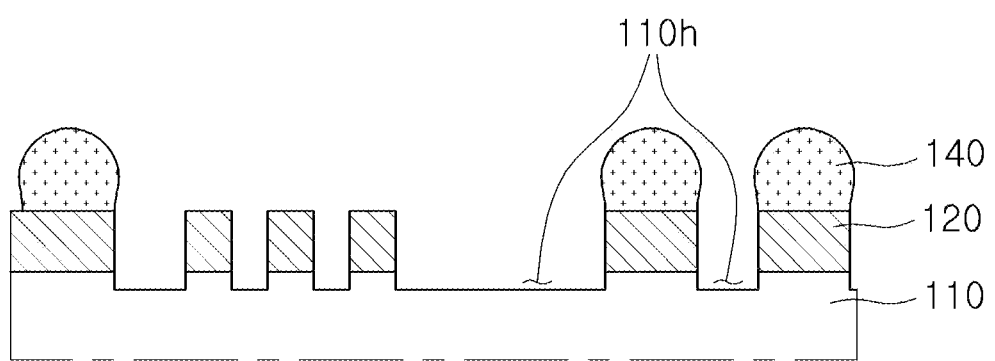
FIG. 19 is an enlarged cross-sectional view of region C of a structure in which a solder is disposed on the printed circuit board of FIG. 17.

FIG. 19 is an enlarged cross-sectional view of region C of a structure in which a solder is disposed on the printed circuit board of FIG. 17.

As shown in FIG. 19, even in the case of the printed circuit board 300 according to the third embodiment of the present disclosure, a solder 140 may be disposed above the first circuit layer 120. In the case of the printed circuit board having the conventional ETS structure, when an upper surface of a circuit pattern is disposed in a position lower than the upper surface of the insulating layer, and a structure embedded in the insulating layer is disclosed, since a solder forms a heterogeneous interface with the circuit layer and the insulating layer on the side surface, respectively, there may be a problem of securing adhesion therebetween.

In the printed circuit board 300 according to the third embodiment of the present disclosure, the first circuit layer 120 completely protrudes above the insulating layer 110, and due to a difference in an etching amount, since a structure in which the recess portion 110h is formed in a region of the insulating layer 110 in which the first circuit layer 120 is not disposed, since a heterogeneous interface is formed only between the solder 140 and the first circuit layer 120, securing adhesion between the insulating layer 120 and the solder 140 is not a problem. In addition, as described above, since roughness is formed above the first circuit layer 120 by blasting processing, adhesion between the first circuit layer 120 and the solder 140 can be sufficiently secured. In addition, prior to bonding with the solder 140, since a surface pretreatment process is not separately required, productivity improvement and process time reduction effects can be achieved.

The printed circuit boards 100, 200 and 300 according to the present disclosure may further include a plurality of circuit layers other than those shown, and may include a metal material. As the metal material, copper (Cu), aluminum (Al), silver (Ag), tin (Sn), gold (Au), nickel (Ni), lead (Pb), titanium (Ti), or alloys thereof may be used. The plurality of circuit layers including the first and second circuit layers and the inner circuit layers may perform various functions according to the design of the corresponding layer. For example, the plurality of circuit layers may include a ground pattern, a power pattern, a signal pattern, or the like. Here, the signal pattern includes various signals, such as data signals, excluding the ground pattern and the power pattern. Each of the patterns may have a line, a plane, and/or a pad shape. The backside wiring layer may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. A specific layer may also further include copper foil.

In addition, the printed circuit board of the present disclosure may further include a plurality of vias in addition to the illustrated vias 130. As a material of the plurality of vias including the via 130, a metal material may be used. As the metal material, copper (Cu), aluminum (Al), silver (Ag), tin (Sn), gold (Au), nickel (Ni), lead (Pb), titanium (Ti), or alloys thereof may be used. The plurality of vias may include a connection via for signal connection, a connection via for ground connection, and a connection via for power connection, and the like according to designs. The plurality of vias may vias in which via holes are completely filled with a metal material, respectively, or a metal material may also be formed along wall surfaces of the via holes. The plurality of vias may have a normal shape such as an hourglass shape or a tapered shape, and may be formed by a plating process such as AP, SAP, MSAP, TT, or the like, and as a result, may include a seed layer, an electroless plating layer, and an electrolytic plating layer formed based on the seed layer. A specific layer may further include copper foil.

Other details are substantially the same as the printed circuit board according to the first embodiment and/the second embodiment, and detailed descriptions of overlapping details will be omitted.

Other details are substantially the same as the printed circuit board according to the first embodiment and/the second embodiment, and detailed descriptions of overlapping details will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, a printed circuit board in which a seed layer on a circuit layer is removed through a blasting method may be provided.

As another one of the various effects of the preset disclosure, a printed circuit board having a circuit pattern of a partially embedded structure of a new type, different from the conventional one may be provided.

As another one of the various effects of the present disclosure, a printed circuit board having improved bonding strength with a solder may be provided.

As another one of the various effects of the present disclosure, a printed circuit board having improved process efficiency during manufacturing by eliminating a pretreatment process of a solder resist layer may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
an insulating layer; and
a first circuit layer disposed on an upper surface of the insulating layer,
wherein the first circuit layer comprises a first region embedded in the insulating layer and a second region protruding from the upper surface of the insulating layer,
wherein an upper surface of the first circuit layer has roughness, and
wherein a first portion of a side surface of the first circuit layer in the second region has a relatively greater roughness than a second portion of the side surface in the second region farther from the upper surface of the first circuit layer than the first portion.

2. The printed circuit board of claim 1, wherein a lower surface and a side surface of the first circuit layer in the first region are in contact with the insulating layer, respectively, and an upper surface and the side surface of the first circuit layer in the second region are exposed from the insulating layer, respectively.

3. The printed circuit board of claim 1, wherein the first circuit layer is composed of a single layer.

4. The printed circuit board of claim 3, wherein the first circuit layer is composed of one plating layer without a seed layer.

5. The printed circuit board of claim 1, wherein the roughness of the upper surface of the first circuit layer is relatively greater than roughness of the side surface of the first circuit layer.

6. The printed circuit board of claim 1, wherein a region of the upper surface of the insulating layer, exposed by the first circuit layer, has roughness.

7. The printed circuit board of claim 1, further comprising a plurality of inner circuit layers embedded inside the insulating layer; and
a second circuit layer disposed on a lower surface of the insulating layer.

8. The printed circuit board of claim 1, further comprising a solder disposed on at least a portion of the first circuit layer.

9. The printed circuit board of claim 1, further comprising a via embedded in the insulating layer and extending from the first circuit layer,
a width of the via increases in a direction from the upper surface of the insulating layer to a lower surface of the insulating layer.

10. A printed circuit board, comprising:
an insulating layer; and
a first circuit layer disposed on an upper surface of the insulating layer,
wherein roughness of an upper surface of the first circuit layer is relatively greater than roughness of a side surface of the first circuit layer,
wherein a first portion of the side surface of the first circuit layer has a relatively greater roughness than a second portion of the side surface of the first circuit layer, and
wherein the second portion is farther from the upper surface of the first circuit layer than the first portion.

11. The printed circuit board of claim 10, wherein roughness of a region of the upper surface of the insulating layer, exposed by the first circuit layer, is relatively greater than roughness of a lower surface of the insulating layer.

12. The printed circuit board of claim 10, wherein the first circuit layer comprises a first region embedded in the insulating layer and a second region protruding from the upper surface of the insulating layer.

13. The printed circuit board of claim 10, wherein the upper surface of the insulating layer has a recess portion, and
the first circuit layer is disposed in a region except for the recess portion of the upper surface of the insulating layer.

14. The printed circuit board of claim 13, wherein a lower surface and a side surface of the recess portion have roughness, and
the roughness of the lower surface of the recess portion is relatively greater than the roughness of the side surface of the recess portion.

15. The printed circuit board of claim 10, further comprising a plurality of inner circuit layers embedded inside the insulating layer; and
a second circuit layer disposed on a lower surface of the insulating layer.

16. The printed circuit board of claim 10, further comprising a via embedded in the insulating layer and extending from the first circuit layer,
a width of the via increases in a direction from the upper surface of the insulating layer to a lower surface of the insulating layer.

17. A printed circuit board, comprising:
an insulating layer; and
a circuit layer disposed on an upper surface of the insulating layer and including at least a portion protruding from the upper surface,
wherein an upper surface of the at least a portion of the circuit layer has roughness,
wherein a first portion of a side surface of the at least a portion of the circuit layer has a relatively greater roughness than a second portion of the side surface of the at least a portion of the circuit layer, and
wherein the second portion is farther from the upper surface of the at least a portion of the circuit layer than the first portion.

18. The printed circuit board of claim 17, wherein patterns of the circuit layer comprise at least a portion protruding from the upper surface of the insulating layer.

19. The printed circuit board of claim 18, wherein the patterns of the circuit layer each comprise another portion embedded in the insulating layer.

20. The printed circuit board of claim 18, wherein surface roughness of the portion of one of the patterns protruding from the upper surface of the insulating layer is greater than surface roughness of the portion of the one of the patterns embedded in the insulating layer.

21. The printed circuit board of claim 17, further comprising a solder disposed on at least a portion of the circuit layer.

22. The printed circuit board of claim 17, further comprising a via embedded in the insulating layer and extending from the circuit layer, a width of the via increases in a direction from the upper surface of the insulating layer to a lower surface of the insulating layer.

\* \* \* \* \*